US008557130B2

(12) United States Patent
Cho et al.

(10) Patent No.: US 8,557,130 B2
(45) Date of Patent: Oct. 15, 2013

(54) NANO-IMPRINT LITHOGRAPHY METHODS (75) Inventors: Young Tae Cho, Suwon-si (KR); Suk Won Lee, Yongin-si (KR); Sin Kwon, Suwon-si (KR); Jung Woo Seo, Hwaseong-si (KR); Jeong Gil Kim, Suwon-si (KR)

(73) Assignee: Samsumg Electronics Co., Ltd., Gyeonggi-Do (KR)

( * ) Notice: Subject to any disclaimer, the term of this patent is extended or adjusted under 35 U.S.C. 154(b) by 298 days.

(21) Appl. No.: 12/654,023

(22) Filed: Dec. 8, 2009

(65) Prior Publication Data
US 2010/0140220 A1 Jun. 10, 2010

(30) Foreign Application Priority Data
Dec. 9, 2008 (KR) ........................ 10-2008-0124379

(51) Int. Cl.
C03C 15/00 (2006.01)
C03C 25/68 (2006.01)
C23F 1/00 (2006.01)

(52) U.S. Cl.
USPC ..................... 216/41; 216/44; 216/48; 216/54

(58) Field of Classification Search
None
See application file for complete search history.

(56) References Cited

U.S. PATENT DOCUMENTS 8,138,088 B2 * 3/2012 Terasaki et al. ............... 438/689
2007/0187875 A1 * 8/2007 Terasaki et al. ............... 264/496
2010/0108639 A1 * 5/2010 Kasono .......................... 216/41

FOREIGN PATENT DOCUMENTS

WO WO2008/126313 * 10/2008

* cited by examiner

Primary Examiner — Nadine G Norton
Assistant Examiner — Stephanie Duclair
(74) Attorney, Agent, or Firm — Harness, Dickey & Pierce, P.L.C.

(57) ABSTRACT

In forming a pattern on a substrate with reduced pattern error using a mold having an area smaller than an area of the substrate, a first resin pattern is formed on at least a first of a plurality of regions of an etching object layer by imprinting resin applied to the etching object layer using a first mold The etching object layer is then etched using the first resin pattern as an etching mask. A second resin pattern is formed on at least a second of the plurality of regions by imprinting resin applied to the etching object layer using a second mold. The etching object layer is again etched using the second resin pattern as an etching mask.

9 Claims, 9 Drawing Sheets

NANO-IMPRINT LITHOGRAPHY METHODS

CROSS-REFERENCE TO RELATED APPLICATION(S)

This application claims priority under 35 U.S.C. §119 to Korean Patent Application No. 10-2008-0124379, filed on Dec. 9, 2008 in the Korean Intellectual Property Office, the entire contents of which is incorporated herein by reference.

BACKGROUND

1. Field

Example embodiments relate to nano-imprint lithography methods for forming a pattern on a substrate with reduced pattern errors by using a mold having an area smaller than an area of the substrate.

2. Description of the Related Art

Generally, nano-imprint lithography is a technology in which a substrate is etched using a resin pattern as an etching mask. Conventionally, the resin pattern is formed by an imprint process. In an example imprint process, thermoplastic resin or photo-curable resin is applied over a substrate, and then the resin is cured while being pressed by a mold formed with a nano-scale pattern having a line width of 1-100 nm.

As compared to conventional photolithography methods, the above-described nano-imprint lithography method realizes formation of a nano-scale pattern via a relatively simple process, and thus, presents relatively high production efficiency, relatively low manufacturing costs, etc. For this reason, nano-imprint lithography methods are receiving considerable attention as a technology for forming circuits for next generation semiconductors and flat panel displays.

This particular nano-imprint lithography method requires a mold having a nano-scale pattern imprinted by electron-beam (e-beam) lithography or laser lithography.

Moreover, forming a pattern on a relatively large-area substrate using such a nano-imprint lithography method requires a relatively large-area mold. However, fabrication of such a relatively large-area mold is relatively difficult. Therefore, a pattern is formed on a relatively large-area substrate using a method in which resin patterns are repeatedly formed on a relatively large-area substrate using a relatively small-area mold prior to etching the substrate. However, the proposed conventional method, in which the relatively large-area substrate is etched after the resin patterns are repeatedly imprinted on the substrate may cause pattern errors because boundaries of the repeatedly imprinted resin patterns are inconsistent. In more detail, when resin is applied to the entire surface of a substrate and resin patterns are formed by imprinting a first region of the substrate and immediately imprinting an adjacent second region of the substrate, the resin applied to the second region is cured along with the resin applied to the first region during imprinting of the first region. This causes pattern errors at boundaries of the resin patterns. Accordingly, when the substrate is etched using the resin patterns as an etching mask the substrate has pattern errors.

SUMMARY

Example embodiments provide nano-imprint lithography methods for forming a pattern on a substrate with reduced pattern errors using a mold having an area smaller than an area of the substrate.

One or more example embodiments provide a nano-imprint lithography method. According to at least one example embodiment, a first resin pattern is formed on some of a plurality of regions of an etching object layer by pressing resin applied to the etching object layer using a first mold. The etching object layer is etched using the first resin pattern as an etching mask. A second resin pattern is formed on others of the plurality of regions by pressing resin repeatedly applied to the etching object layer using a second mold. The etching object layer is then etched using the second resin pattern as an etching mask.

One or more example embodiments provide a nano-imprint lithography method. According to at least one example embodiment, a first resin pattern is formed on at least a first of a plurality of regions of an etching object layer by pressing resin applied to the etching object layer using a first mold. The first of the plurality of regions of the etching object layer are etched using the first resin pattern as an etching mask. A second resin pattern is formed on at least a second of the plurality of regions by pressing resin repeatedly applied to the etching object layer using a second mold. The second of the plurality of regions of the etching object layer is etched using the second resin pattern as an etching mask.

According to at least some example embodiments, a third resin pattern is formed on at least a third of a plurality of regions of an etching object layer by pressing resin applied to the etching object layer using a third mold. The third of the plurality of regions of the etching object layer are etched using the third resin pattern as an etching mask. A fourth resin pattern is formed on at least a fourth of the plurality of regions by pressing resin repeatedly applied to the etching object layer using a fourth mold. The fourth of the plurality of regions of the etching object layer is etched using the fourth resin pattern as an etching mask.

According to at least some example embodiments, an area of the first mold and an area of the second mold may be smaller than an area of the etching object layer. The resin may be thermoplastic resin or ultraviolet curable resin. The second mold may have the same as, substantially the same as or a different pattern than that of the first mold. The etching object layer may be one of a substrate and a hard mask layer for etching the substrate. The first resin pattern may be formed at a plurality of regions, and respective ones of the plurality of regions may be spaced apart from one another.

BRIEF DESCRIPTION OF THE DRAWINGS

Example embodiments will become apparent and more readily appreciated from the following description taken in conjunction with the accompanying drawings of which:

FIGS. 3(a) to 3(j) are sectional views taken along the line A-A' of FIG. 2 illustrating the sequence of the nano-imprint lithography method of FIG. 1;

FIGS. 6(a) to 6(l) are sectional views taken along the line B-B' of FIG. 5 illustrating the sequence of the nano-imprint lithography method of FIG. 4;

FIGS. 9(a) to 9(k) are sectional views taken along the line C-C' of FIG. 8 illustrating the sequence of the nano-imprint lithography method of FIG. 7.

DETAILED DESCRIPTION

Example embodiments will now be described more fully with reference to the accompanying drawings, in which some example embodiments are shown. In the drawings, the thicknesses of layers and regions are exaggerated for clarity. Like reference numerals in the drawings denote like elements. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

It should be understood, however, that there is no intent to limit the general inventive concept to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. Various example embodiments of the present invention will now be described more fully with reference to the accompanying drawings in which some example embodiments of the invention are shown. In the drawings, the thicknesses of layers and regions are exaggerated for clarity.

A nano-imprint lithography method according to an example embodiment will be described with reference to FIGS. 1 to 3.

Figure 1:
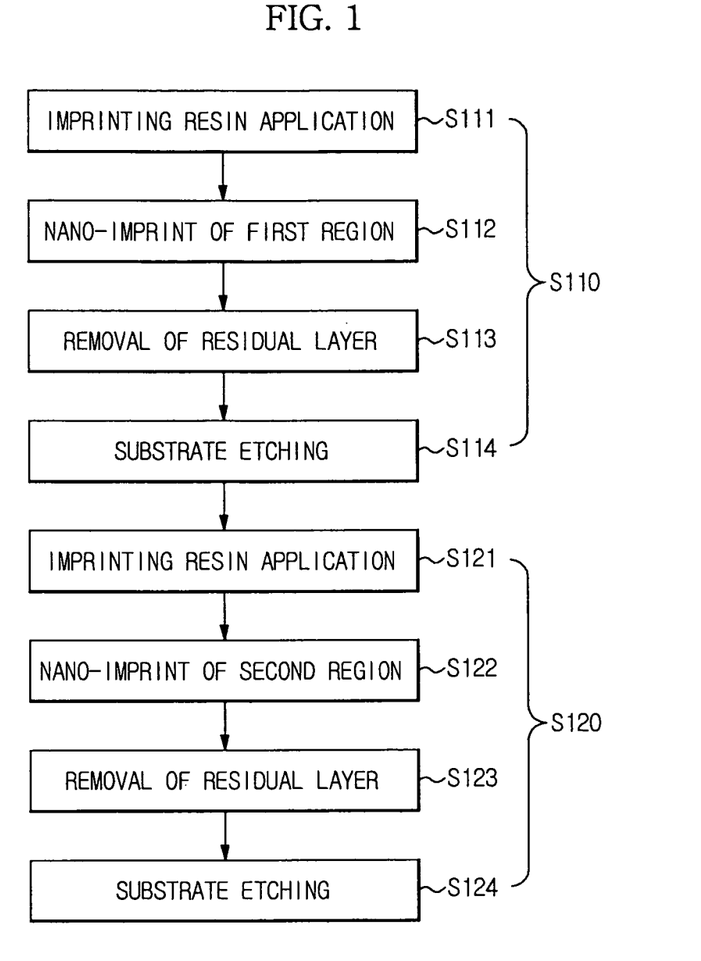
FIG. 1 is a flow chart illustrating a nano-imprint lithography method according to an example embodiment.

Referring to FIG. 1, in a nano-imprint lithography method according to an example embodiment, at S110 at least one of a plurality of regions of an etching object layer is etched using a resin pattern as an etching mask. In this example, the resin pattern is formed by an imprint process. At S120, at least one other of the plurality of regions of the etching object layer is etched using a resin pattern as an etching mask. This resin pattern is also formed by an imprint process. In the nano-imprint lithography method according to at least this example embodiment, the etching object layer is a substrate.

Figure 2:
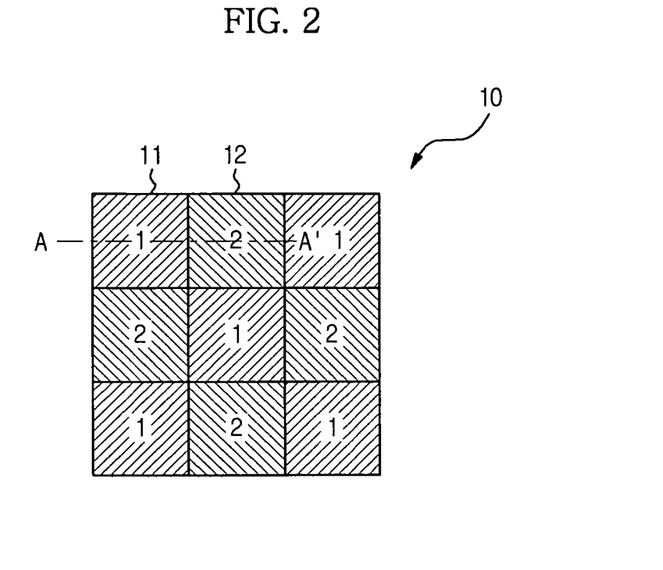
FIG. 2 is a plan view schematically illustrating a substrate used in the nano-imprint lithography method of FIG. 1.
Figure 3:
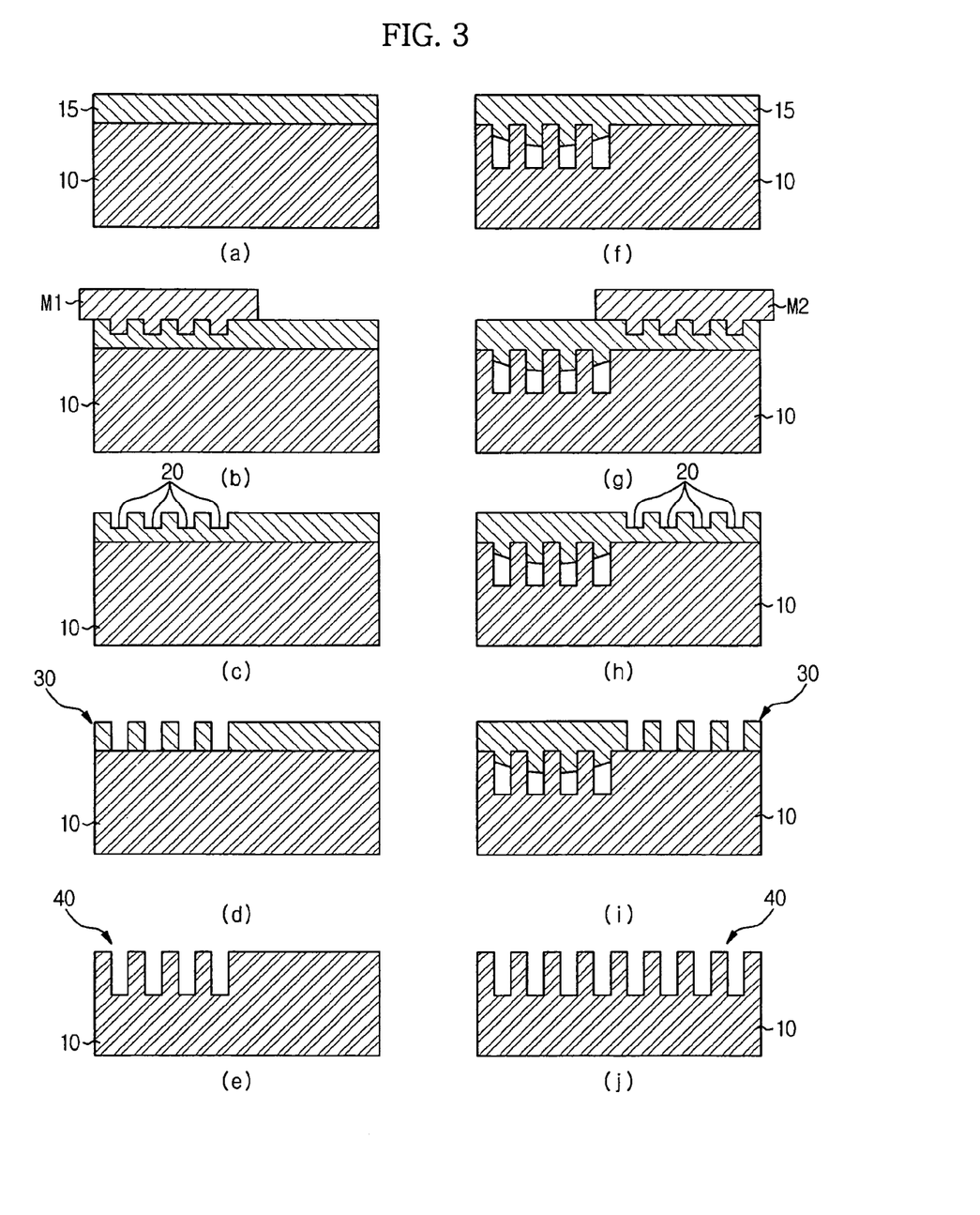

Referring now to FIGS. 1 to 3, at S110 a first region 11 of a substrate 10 is subjected to an imprint process and an etching process. As shown in FIG. 3(a), for example, at S111 an imprinting resin 15 is applied to the substrate 10. In this case, a spring coating method, a slit coating method, and a dispensing method may be used to apply the imprinting resin 15 over the substrate 10. A material of the imprinting resin 15 may be changed based on whether a following imprint process is a thermoplastic imprint process or an ultraviolet curing imprint process.

As shown in FIGS. 3(b) and 3(c), at S112 the first region 11 of the substrate 10 is then subjected to an imprint process using a mold M1. More specifically, for example, the imprinting resin 15 is cured while being pressed by the mold M1. Here, the imprint process using the mold M1 may be a generally known thermoplastic imprint process or ultraviolet curing imprint process.

After completion of the imprint process, at S113 a residual layer 20 as shown in FIG. 3(c) is removed. An ashing process may be used to remove the residual layer 20. With removal of the residual layer 20, as shown in FIG. 3(d), a resin pattern 30 is formed over the substrate 10.

At S114, the substrate 10 is etched using the resin pattern 30 as an etching mask to form a pattern 40 corresponding to the resin pattern 30 as shown in FIG. 3(e).

Still referring to FIGS. 1 to 3, at S120 a second region 12 of the substrate 10 as an etching object layer is then subjected to an imprint process and an etching process. More specifically, as shown in FIG. 3(f), at S121 the imprinting resin 15 is again applied to the patterned substrate 10.

As shown in FIGS. 3(g) and 3(h), at S122 the second region 12 of the substrate 10 is subjected to an imprint process using a mold M2. Here, the mold M2 used in the imprint process may have the same, substantially the same pattern or a different pattern than that of the mold M1 used at S112.

After completion of the imprint process, a residual layer 20 as shown in FIG. 3(h) is removed at S123. An ashing process may be used to remove the residual layer 20 similar to the operation described with regard to S113. With removal of the residual layer 20, as shown in FIG. 3(i), a second resin pattern 30 is formed over the substrate 10.

At S124, the substrate 10 is etched using the second resin pattern 30 as an etching mask to form a pattern 40 corresponding to the second resin pattern 30 as shown in FIG. 3(j).

With nano-imprint lithography methods according to the above-described example embodiment, pattern errors are reduced due to relay formation of resin patterns, which are caused when forming a second resin pattern on a second region immediately after forming the first resin pattern on the first region without etching of the first region. According to example embodiments, alternately repeating the imprint process and the etching process (e.g., the imprint process→the etching process→the imprint process→the etching process) may reduce (e.g., substantially reduce) pattern errors due to relay formation of resin patterns.

Hereinafter, a nano-imprint lithography method according to another example embodiment will be described with reference to FIGS. 4 to 6.

Figure 4:
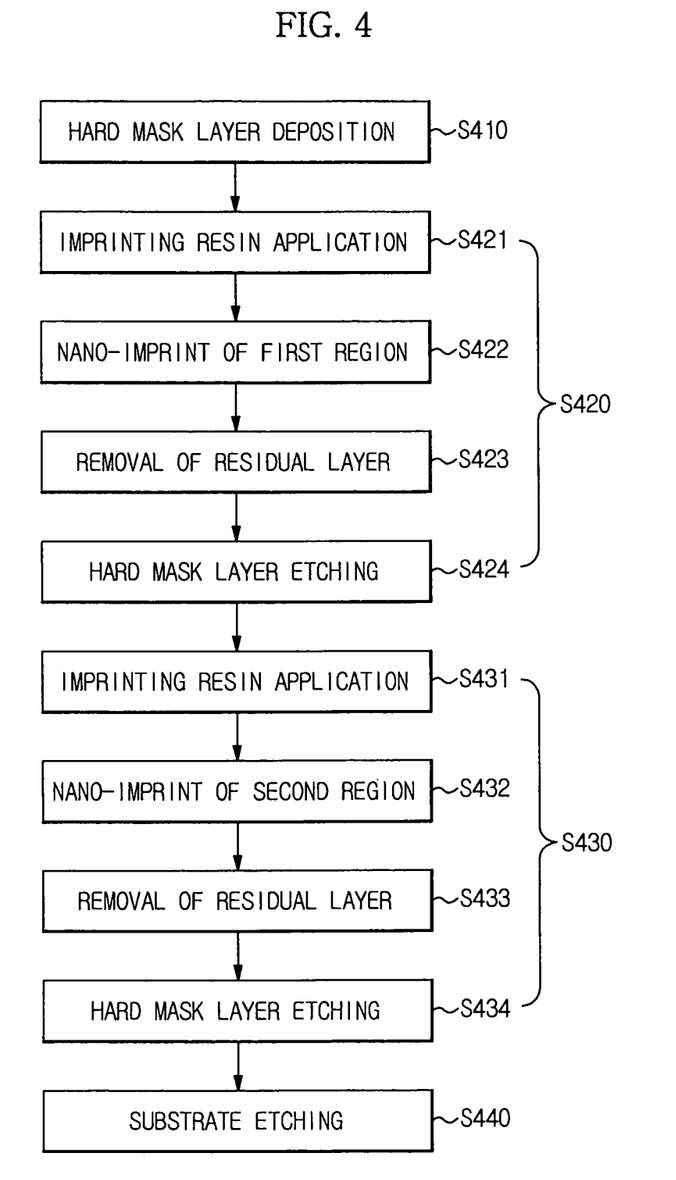
FIG. 4 is a flow chart illustrating a nano-imprint lithography method according to another example embodiment.
Figure 5:
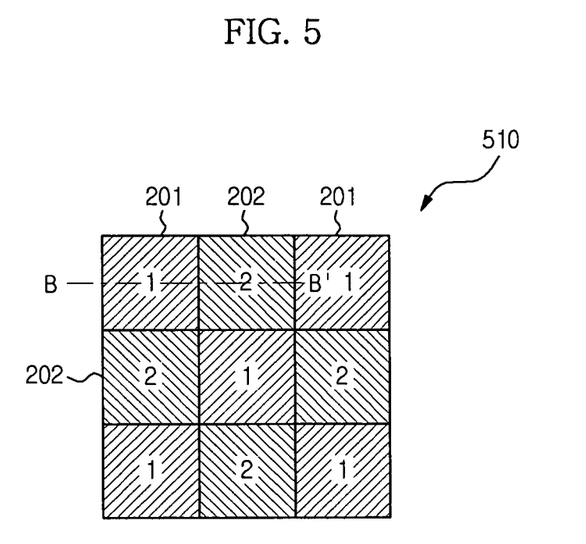
FIG. 5 is a plan view schematically illustrating a substrate used in the nano-imprint lithography method of FIG. 4.
Figure 6:
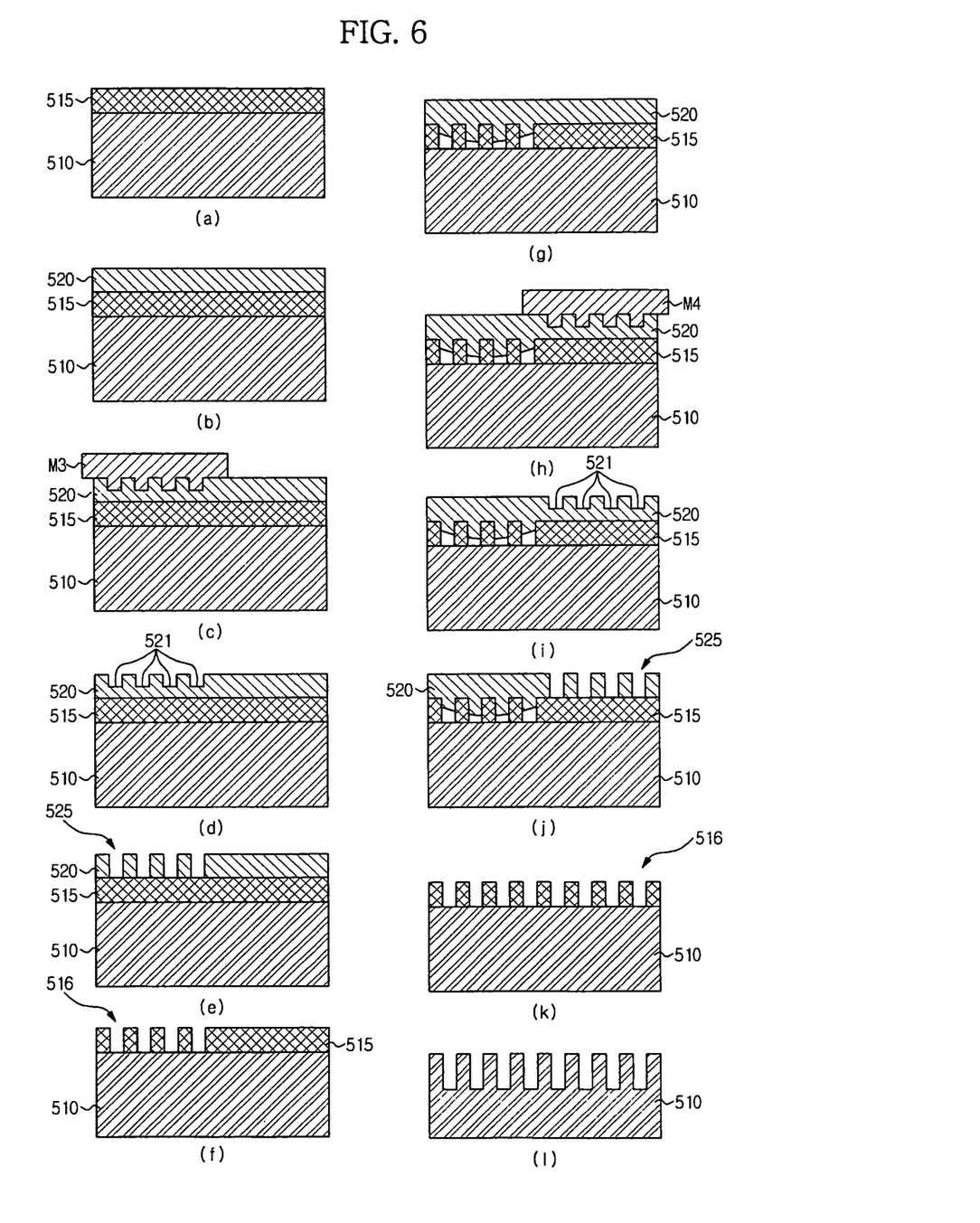

In the nano-imprint lithography method shown in FIGS. 4 to 6, at S410 a hard mask layer 515 is deposited on the substrate 510 prior to applying imprinting resin 520. A first region 201 of the hard mask layer 515 is then subjected to an imprint process and a hard mask layer etching process at S420, and a second region 202 is subjected to an imprint process and a hard mask layer etching process at S430 to form a hard mask pattern 516.

More specifically, as shown in FIG. 6(b), at S421 imprinting resin 520 is applied to the hard mask layer 515. As shown in FIGS. 6(c) and 6(d), at S422 the first region 201 of the substrate 510 is subjected to an imprint process using a mold M3. After completion of the imprint process, at S423 the residual layer 521 shown in FIG. 6(d) is removed. With removal of the residual layer 521, a resin pattern 525 is formed on the hard mask layer 515 as shown in FIG. 6(e).

At S424, the hard mask layer 515 is etched using the resin pattern 525 as an etching mask to form a hard mask pattern 516 corresponding to the resin pattern 525 as shown in FIG. 6(f).

Still referring to FIGS. 4 to 6, at S430 the second region 202 of the substrate 510 is subjected to an imprint process and an etching process. More specifically, as shown in FIG. 6(g), at S431 the imprinting resin 520 is applied to the patterned hard mask layer 515.

As shown in FIGS. 6(h) and 6(i), at S432 the second region 202 of the substrate 510 is subjected to an imprint process using a mold M4.

After completion of the imprint process, a residual layer 521 as shown in FIG. 6(i) is removed at S433. With removal of the residual layer 521, a second resin pattern 525 is formed on the patterned hard mask layer 515 as shown in FIG. 6(j).

At S434, the hard mask layer 515 is etched using the second resin pattern 525 as an etching mask to form a pattern 516 corresponding to the second resin pattern 525 shown in FIG. 6(k).

At S440, the substrate 510 is etched using the hard mask pattern 516 as an etching mask as shown in FIG. 6(l). Here, the hard mask layer 515 is made of a material different from the imprinting resin 520. For example, the hard mask layer 515 may be comprised of a material suitable to function as an etching mask such as a material selected from among $SiO_2$, SiN, etc.

Other details of the nano-imprint lithography method of this example embodiment will be clearly understood when comparing reference numerals of FIGS. 4 to 6 with those of the nano-imprint lithography method of the example embodiment described with regard to FIGS. 1-3, and thus, a description thereof will be omitted herein.

With the nano-imprint lithography method according to the example embodiment shown in FIGS. 4 to 6, as a result of the hard mask pattern 516, which is different from the imprinting resin 520, functioning as an etching mask, enhancement relative to the functionality of the etching mask may be accomplished.

Hereinafter, a nano-imprint lithography method according to another example embodiment will be described with reference to FIGS. 7 to 9.

Figure 7:
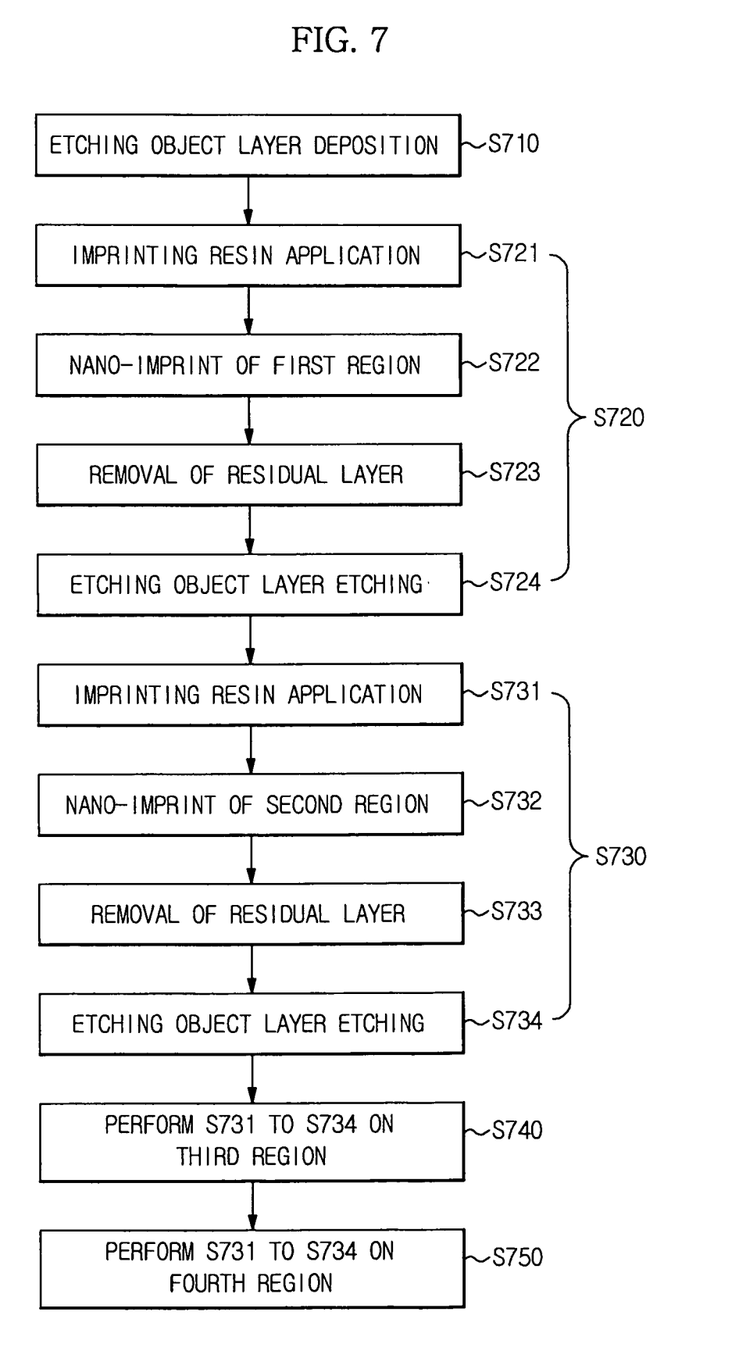
FIG. 7 is a flow chart illustrating a nano-imprint lithography method according to another example embodiment.
Figure 8:
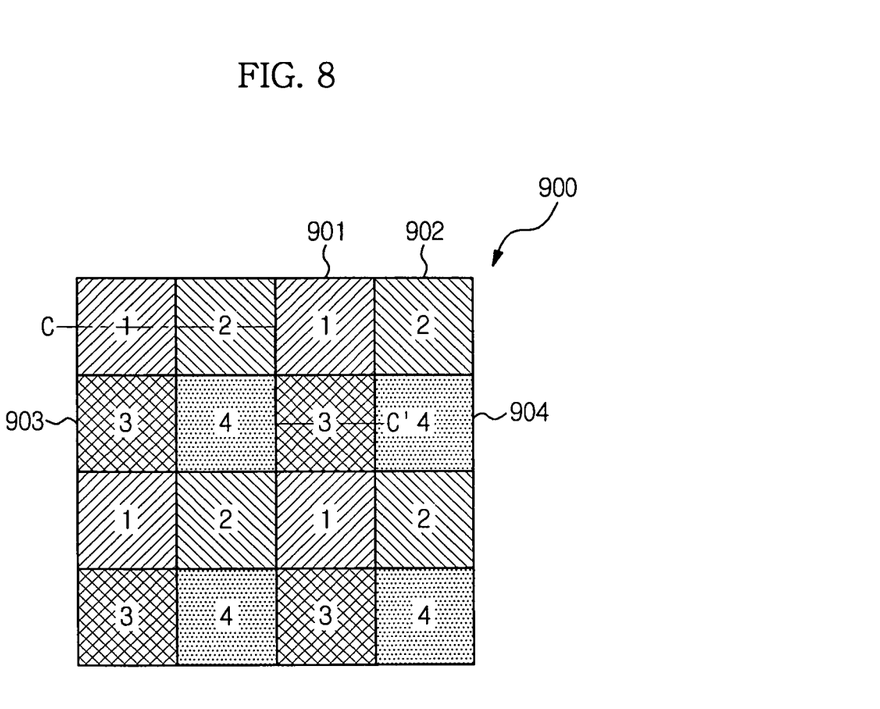
FIG. 8 is a plan view schematically illustrating a substrate used in the nano-imprint lithography method of FIG. 7.
Figure 9:
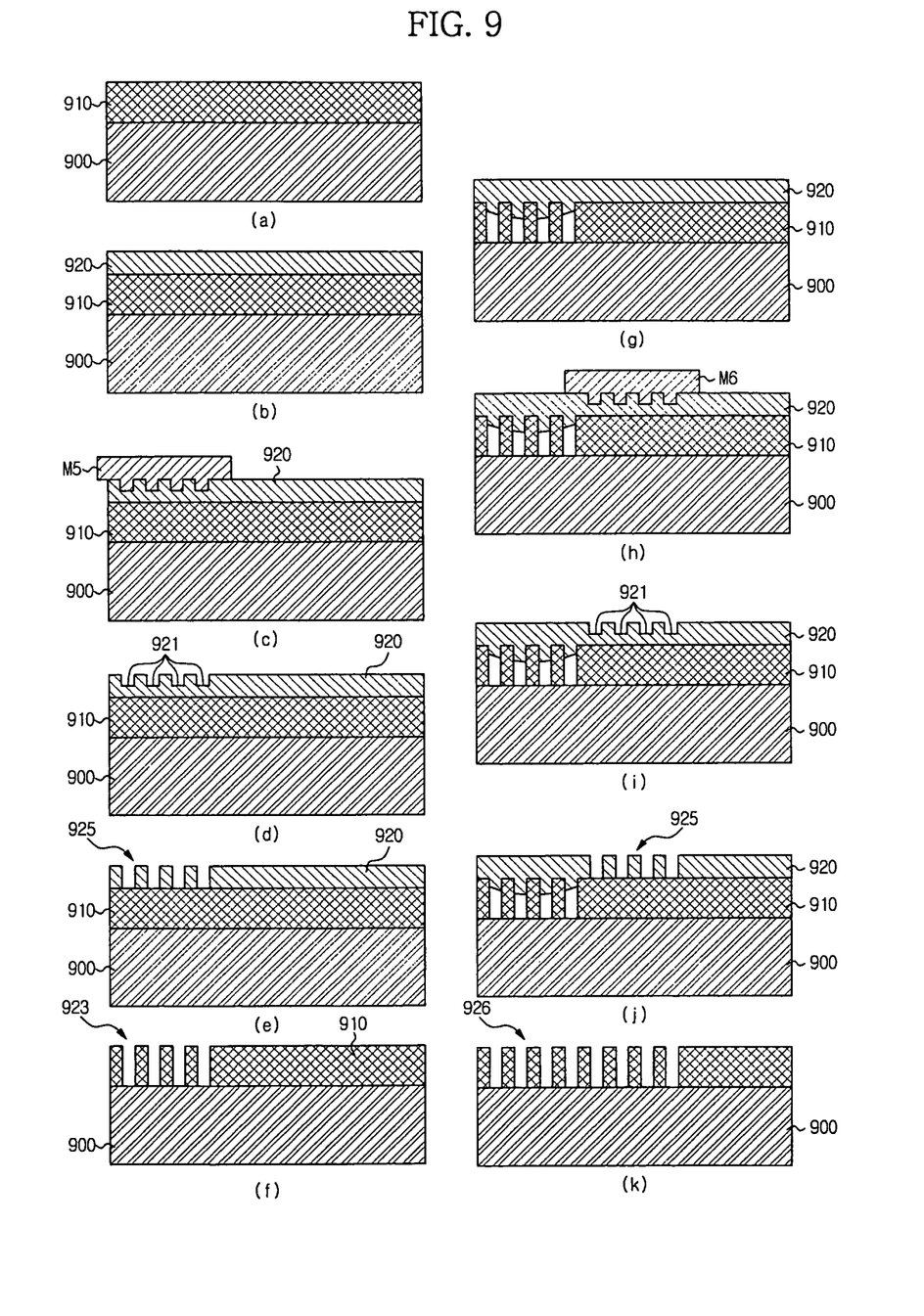

In the nano-imprint lithography method shown in FIGS. 7 to 9, at S710 an etching object layer 910 is deposited on a substrate 900 prior to applying imprinting resin 920. Here, the etching object layer 910 is made of, for example, SiN or the like.

The first to fourth regions 901 to 904 are then subjected to an imprint process and an etching process at S720, S730, S740 and S750, respectively. In the imprinting processes S720 and S730, the etching object layer 910 is etched at S724 and S734, respectively. For example, a plurality of regions on which resin patterns 925 (see, e.g., FIG. 9) are formed, and respective ones of the plurality of regions are spaced apart from one another.

More specifically, with regard to FIGS. 7 to 9, at S710 an etching object layer 910 is deposited on the substrate 900. At S721, an imprinting resin layer 920 is applied to the etching object layer 910. At S722, as shown in FIGS. 9(c) and 9(d), the first region 901 of the substrate 900 is subjected to an imprint process using a mold M5. After completion of the imprint process, at S723 a residual layer 921 as shown in FIG. 9(d) is removed. With removal of the residual layer 921, as shown in FIG. 9(e), a resin pattern 925 is formed on the etching object layer 910.

At S724, the etching object layer 910 is etched using the resin pattern 925 as an etching mask to form an etching object layer pattern 923 corresponding to the resin pattern 925 as shown in FIG. 9(f).

Still referring to FIGS. 7 to 9, at S730 a second region 902 of the substrate 900 is subjected to an imprint process and an etching process. More specifically, as shown in FIG. 9(g), at S731 the imprinting resin 920 is applied to the patterned etching object layer 910.

As shown in FIGS. 9(h) and 9(i), at S732 the second region 902 of the substrate 900 is subjected to an imprint process using a mold M6.

After completion of the imprint process, a residual layer 921 as shown in FIG. 9(i) is removed at S733. With removal of the residual layer 921, as shown in FIG. 9(j), a second resin pattern 925 is formed on the patterned etching object layer 910.

At S734, the etching object layer 910 is etched using the second resin pattern 925 as an etching mask to form a pattern 926 corresponding to the second resin pattern 925 shown in FIG. 9(k).

At S740, operations S731 to S734 are repeated on the third region 903 of the substrate 900. At S750, operations S731 to S734 are repeated on the fourth region 904 of the substrate 900.

Other details of the nano-imprint lithography method of this example embodiment will be more clearly understood when comparing reference numerals of FIGS. 7 to 9 with those of the nano-imprint lithography method of the example embodiment described with regard to FIGS. 1-3, and thus, a description thereof will be omitted herein.

With the nano-imprint lithography method of this example embodiment as shown in FIGS. 7 to 9, enhancement in the accuracy of the imprint process may be accomplished.

As is apparent from the above description, nano-imprint lithography methods according to example embodiments may form a pattern on a substrate with reduced pattern error using a mold having an area smaller than an area of the substrate.

Although a few example embodiments have been shown and described, it would be appreciated by those skilled in the art that changes may be made to these example embodiments without departing from the principles and spirit, the scope of which is defined in the claims and their equivalents.

What is claimed is:

1. A nano-imprint lithography method comprising:
forming a first resin pattern on at least a first of a plurality of regions of an object layer by imprinting a first resin layer applied to the object layer using a first mold;
etching the first of the plurality of regions of the object layer using the first resin pattern as an etching mask;
forming a second resin pattern on at least a second of the plurality of regions by imprinting a second resin layer applied to the etched object layer using a second mold; and
etching the second of the plurality of regions of the object layer using the second resin pattern as an etching mask, wherein the first of the plurality of regions is not etched when etching the second of the plurality of regions of the object layer.

2. The method according to claim 1, wherein an area of the first mold and an area of the second mold are smaller than an area of the object layer.

3. The method according to claim 1, wherein the first and second resin layers are one of a thermoplastic resin and an ultraviolet curable resin.

4. The method according to claim 1, wherein the second mold has the same or a different pattern compared to that of the first mold.

5. The method according to claim 1, wherein the object layer is one of a substrate and hard mask layer, the hard mask layer being for etching of the substrate.

6. The method according to claim 1, wherein the first resin pattern is formed at a plurality of regions, and respective ones of the plurality of regions are spaced apart from one another.

7. The method of claim 1, further comprising:
forming the object layer on a substrate.

8. The method of claim 1, wherein the object layer is a hard mask layer, the method further comprising:
forming the hard mask layer on a substrate.

9. The method of claim 1, further comprising:
forming a third resin pattern on at least a third of the plurality of regions of the object layer by imprinting a third resin layer applied to the etched object layer using a third mold;
etching the third of the plurality of regions of the object layer using the third resin pattern as an etching mask;
forming a fourth resin pattern on at least a fourth of the plurality of regions by imprinting a fourth resin layer applied to the etched object layer using a fourth mold; and
etching the fourth of the plurality of regions of the object layer using the fourth resin pattern as an etching mask.

* * * * *